United States Patent
Om et al.

(10) Patent No.: US 7,084,662 B1
(45) Date of Patent: Aug. 1, 2006

(54) VARIABLE IMPEDANCE OUTPUT DRIVER

(75) Inventors: Hari Om, Santa Clara, CA (US); Andrew J. Wright, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 47 days.

(21) Appl. No.: 10/773,816

(22) Filed: Feb. 6, 2004

Related U.S. Application Data (60) Provisional application No. 60/447,132, filed on Feb. 12, 2003.

(51) Int. Cl.
*H03K 19/003* (2006.01)

(52) U.S. Cl. .......................................... 326/30; 326/21
(58) Field of Classification Search .................... 326/30
See application file for complete search history.

(56) References Cited

U.S. PATENT DOCUMENTS

| | | | |
|---|---|---|---|
| 6,166,563 A * | 12/2000 | Volk et al. ..................... 326/87 |
| 6,384,621 B1 | 5/2002 | Gibbs et al. |
| 6,541,996 B1 * | 4/2003 | Rosefield et al. ............. 326/30 |
| 6,762,620 B1 * | 7/2004 | Jang et al. ..................... 326/30 |

* cited by examiner

*Primary Examiner*—James H. Cho
(74) *Attorney, Agent, or Firm*—Blakely, Sokoloff, Taylor & Zafman (57) ABSTRACT

A variable impedance output driver has been disclosed. One embodiment of the variable impedance output driver includes a first pull-up structure, a pull-down structure, and a comparator, coupled to the first pull-up structure and the pull-down structure, to calibrate the first pull-up structure and the pull-down structure against a reference impedance. Other embodiments are described and claimed.

21 Claims, 8 Drawing Sheets

VARIABLE IMPEDANCE OUTPUT DRIVER

REFERENCE TO RELATED APPLICATION

This application claims the benefit of U.S. Provisional Application No. 60/447,132, filed on Feb. 12, 2003.

FIELD OF INVENTION

The present invention relates generally to integrated circuit output drivers, and more particularly, to variable impedance output drivers.

BACKGROUND

Precise control over the impedance of output drivers is becoming an increasingly important factor in system designs, particularly those involving multiple integrated circuits (ICs) and one or more common buses. In such arrangements, it is typically important to match the impedance of a driver to the impedance of a transmission line in order to minimize signal reflections and preserve signal integrity.

Figure 1:
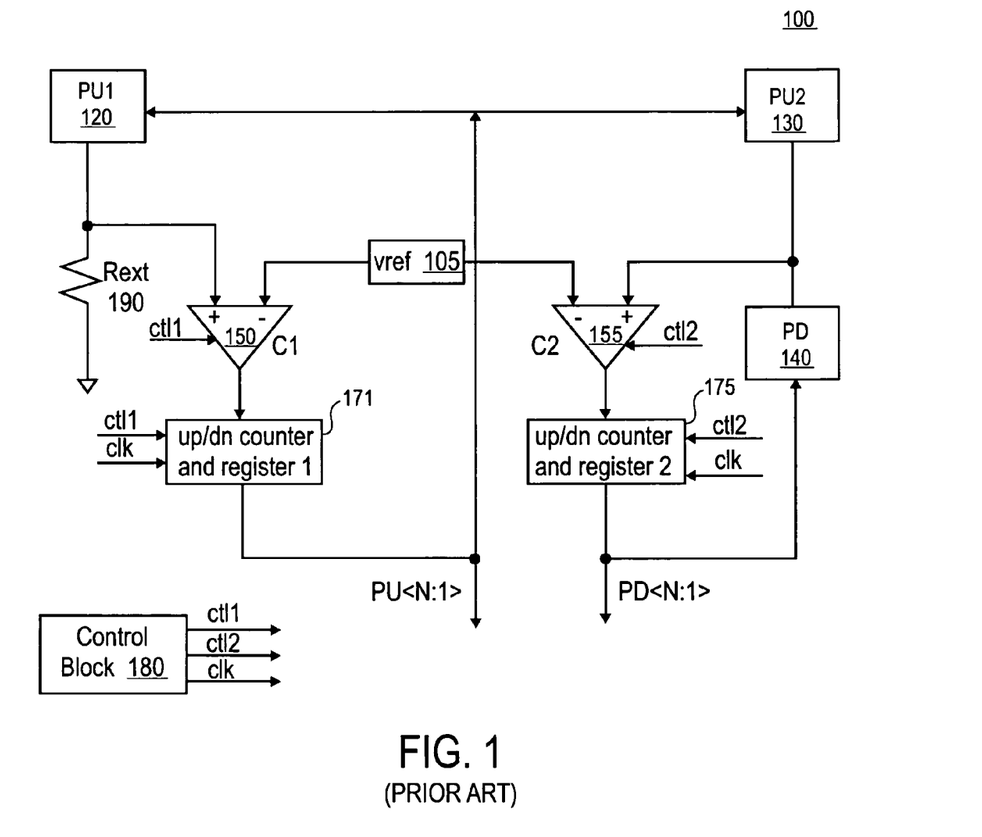
FIG. 1 shows an existing replica circuit for a variable impedance output driver.

An existing solution involves the basic approach of providing a replica circuit for sensing the value of an external (i.e., to the IC) resistor and enabling an appropriate number of fingers in the output driver pull-up (PU) and/or pull-down (PD) structures to match the on-chip driver impedance to an external impedance. FIG. 1 shows such a replica circuit where Rext 190 is the external calibrating resistor, C1 150 and C2 155 are comparators, and PU1 120 and PU2 130 are output pull-up structures implemented similarly. PU1 120 and PU2 130 each include multiple fingers and each finger has a p-type metal oxide semiconductor (pMOS) transistor in series with an on-chip resistor. Similarly, PD 140 includes multiple fingers. Each finger has an n-type metal oxide semiconductor (NMOS) transistor in series with an on-chip resistor. Vref 105 is a reference voltage generator that generates the voltage at which the impedance of the driver is to be matched. The control block 180 generates the clock and control signals to align various timings of the system. There are two feedback loops in the system: (1) a left loop comprised of comparator C1 150, n-bit up/down counter and register set 1 171, and PU1 120 and (2) a right loop comprised of comparator C2 155, up/down counter and register set 2 175, and PD 140.

Initially, the left loop can be enabled while the right loop is disabled. Every time the comparator C1 150 finds a difference in voltage on the positive and negative terminal of the comparator C1 150, the counter in the up/down counter and register set 1 171 is incremented or decremented accordingly, which in turn, turns off or on fingers in PU1 120. This process continues till the impedance of PU1 120 substantially equals Rext 190. The corresponding n-bit word can be stored in the register in the up/down counter and register set 1 171.

Once the PU1 120 array bits are stored in the register in the up/down counter and register set 1 171, the left loop may be disabled and the right loop enabled. By symmetry, the impedance of the PU2 130 is substantially the same as the impedance of PU1 120. The n-bit counter in the up/down counter and register set 2 175 is incremented or decremented so that the impedance of PD 140 becomes substantially equal to the impedance of PU2 130. The word indicating this final value can be stored in a register in the counter and register set 2 175.

Figure 2:
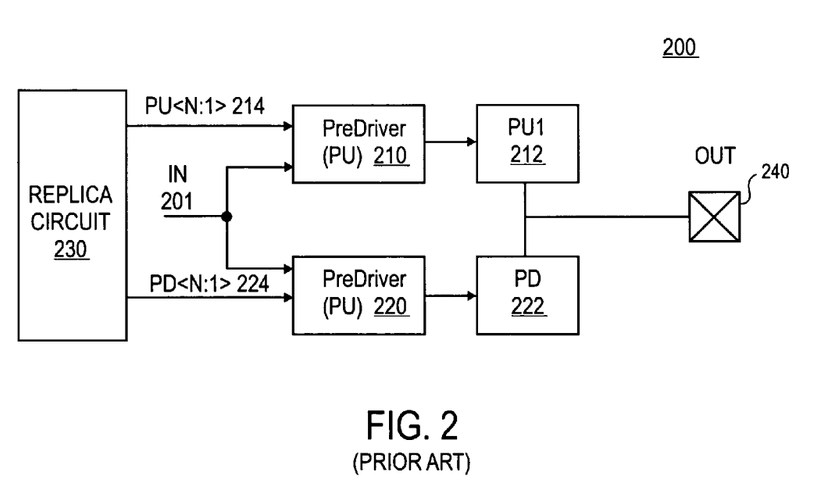
FIG. 2 shows an existing variable impedance output driver.

FIG. 2 shows an associated output driver circuit 200. The associated output driver circuit 200 includes a PU1 212 structure and a PD 222 structure, which are substantially the same as PU1 120 and PD 140 in the replica circuit of FIG. 1. The signals PU<N:1> and PD<N:1> from the replica circuit of FIG. 1 are the inputs to the predriver stages Predrv (PU) 210 and Predrv (PD) 220, respectively, which enable the same number of fingers as determined in the corresponding replica PU1 120 or PD 140 of FIG. 1. The full n-bit conversion can be done at chip power up and minor re-calibration can be done again after powering up to accommodate for power supply or temperature changes.

However, the above approach has some drawbacks. One of the drawbacks is the dependence of the impedance of PU2 130 and PU1 120 on the input offset voltage of comparator C1 150 and another comparator C2 155 input offset in the loop on the right to calibrate the impedance of PD 140. This can introduce possibly two comparator input offset error components in the impedance determination of PD 140. Furthermore, the impedance of PU2 130, which serves as a reference for PD 140, relies on the matching between PU1 120 and PU2 130. In practice, there may be some sort of device mismatch between PU1 120 and PU2 130, including parasitic mismatch and resistor mismatch, and this can introduce another error factor in the PD 140 impedance determination.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 3A:
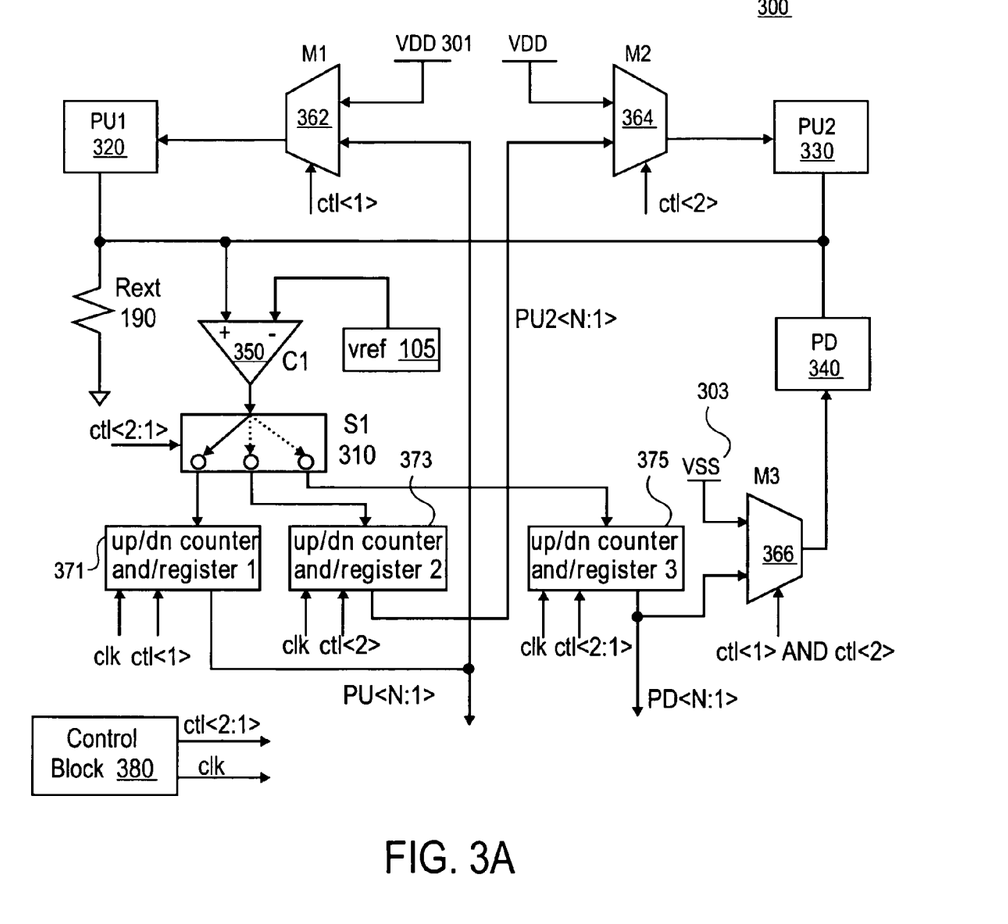
FIG. 3A shows one embodiment of a replica circuit.

FIG. 3A shows one embodiment of a replica circuit 300 for a variable impedance output driver within a microelectronic device. The replica circuit 300 includes a switch S1 310, a first pull-up structure PU1 320, a second pull-up structure PU2 330, a pull-down structure PD 340, a comparator C1 350, a first multiplexer M1 362, a second multiplexer M2 364, a third multiplexer M3 366, three up/down counter and register sets 371, 373, and 375, a control block 380, and a reference impedance Rext 390. Each of the up/down counter and register sets 371, 373, and 375 may include a register and a counter. A first voltage supply 301, VDD, is input to both multiplexer M1 362 and multiplexer M2 364. A second voltage supply 303, VSS, is input to multiplexer M3 366. A reference voltage vref 305 is input to the negative terminal of comparator C1 350. The reference impedance Rext 390 and the comparator C1 350 may reside on the same integrated circuit die. Alternatively, the reference impedance Rext 390 may reside on a separate integrated circuit die from the comparator C1 350. For example, the reference impedance Rext 390 may reside on a package substrate or a printed circuit board substrate. Moreover, the reference impedance may include a resistor external to the microelectronic device.

In one embodiment, the replica circuit 300 includes a control block 380 to provide control signals, ctl<2:1>, to the switch S1 310. In response to ctl<2:1>, the switch S1 310 couples the output of comparator C1 350 to one of the three up/down counter and register sets 371, 373, and 375. Note that for the purpose of illustration, the leftmost switch position is illustrated in FIG. 3A by a solid line/arrow, while the other two possible switch positions are shown as dashed lines/arrows. The control block 380 provides ctl<1> and ctl<2> to the up/down counter and register sets 371, 373, and 375. In addition, the control block 380 may provide a clock signal to each of the up/down counter and register sets 371, 373, and 375. Furthermore, the control block 380 may provide ctl<1> to multiplexer M1 362, ctl<2> to multiplexer M2 364, and ctl<2:1> to multiplexer M3 366. In response to ctl<1> and ctl<2>, the multiplexers M1 362, M2 364, and M3 366 may enable or disable PU1 320, PU2 330, and PD 340, respectively.

In one embodiment, PU1 320 and PU2 330 are substantially identical. However, one should appreciate that mismatches between PU1 320 and PU2 330 may exist due to device mismatch and process variation. Each of PU1 320 and PU2 330 may include a number of fingers (not shown). Each finger may include a pMOS transistor in series with an on-chip resistor. Likewise, PD 340 may include a number of fingers (not shown), each of which has an nMOS transistor in series with an on-chip resistor.

Referring to FIG. 3A, the architecture depicted includes three feedback loops: (1) a left loop comprising comparator C1 350, counter and register set 371, and PU1 320, (2) an intermediate loop comprising comparator C1 350, counter and register set 373, and PU2 330, and (3) a right loop comprising comparator C1 350, counter and register set 375, and PD 340.

The typical operation of the replica circuit 300 will now be described in some detail. Initially, PU1 320 may be enabled while PU2 330 and PD 340 are disabled. The counter in counter and register set 1 371 can continue updating a count until the difference between the voltages on the negative and positive terminals of comparator C1 350 is within the comparator offset voltage. As a result, the voltages on the negative and positive terminals of comparator C1 350 are substantially equal, and hence, the impedance of PU1 320 substantially equals the impedance of Rext 390. The corresponding count can be stored in a register in counter and register set 1 371 as PU1<N:1>.

Next, the intermediate loop may be enabled while PU1 320 and PD 340 are disabled. Similar to the calibration of PU1 described above, the counter and register set 2 373 increments or decrements until the impedance of PU2 330 substantially equals the impedance of Rext 390. The corresponding count can be stored in a register in counter and register set 2 373.

Figure 4:
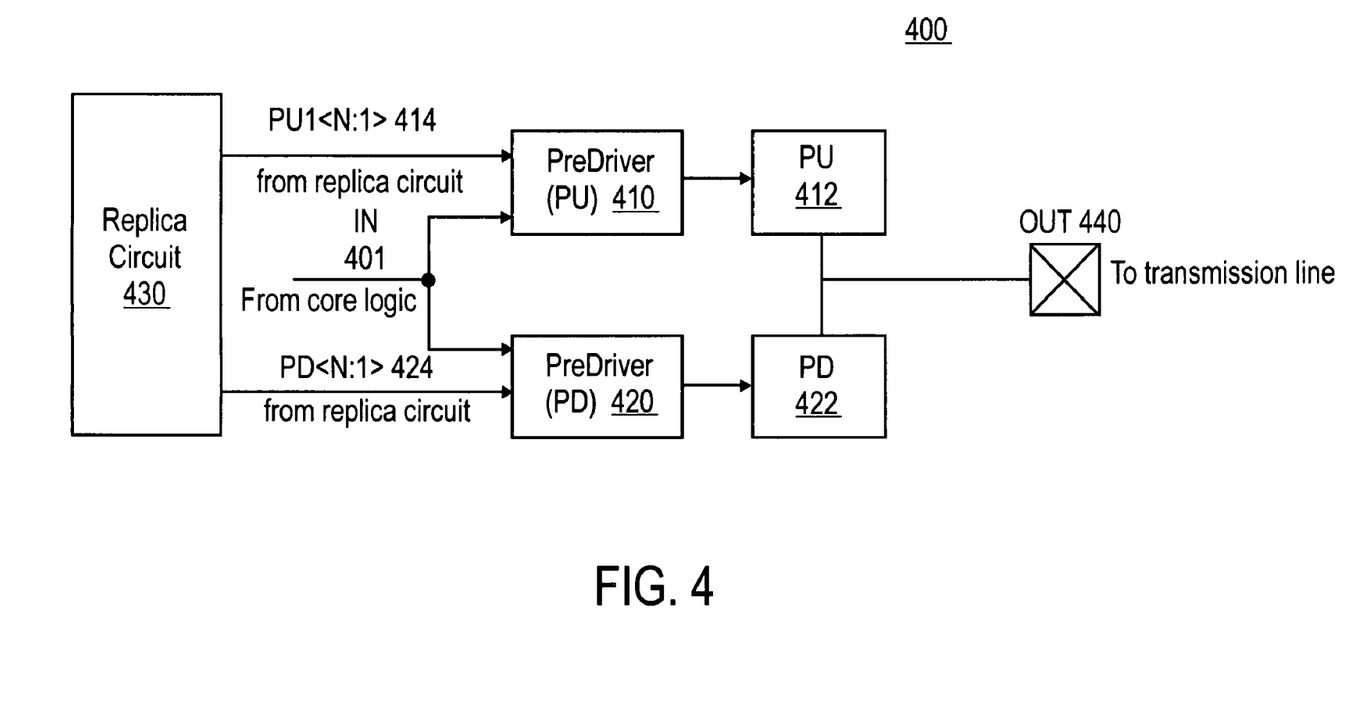
FIG. 4 shows one embodiment of a variable impedance output driver.

Finally, the right loop may be enabled along with PU1 320 and PU2 330. The counter in counter and register set 3 375 can be incremented or decremented until the impedance of PD 340 substantially equals the impedance of Rext 390. This count can be stored in the counter and register set 3 375 as PD<N:1>. The signals PU1<N:1> and PD<N:1> are then input to an output driver as shown in FIG. 4 to enable the same number of fingers in the PU1 412 and PD 422 structures, respectively, of the output driver circuit 400 as in the replica circuit 300. More details of FIG. 4 will be discussed below.

It should be appreciated that the replica circuit 300 illustrated in FIG. 3A uses one comparator, C1 350, to calibrate PU1 320, PU2 330, and PD 340. In contrast with the existing design shown in FIG. 1, which uses two comparators 150 and 155 to calibrate PU1 120, PU2 130, and PD 140, the replica circuit 300 reduces the associated error components by one comparator input offset voltage. Furthermore, the replica circuit 300 does not rely on matching PU1 320 and PU2 330, and thus, further reduces the possible sources of error. Moreover, PU2 330 is calibrated against Rext 390 directly instead of indirectly via PU1 320, and thus, further improving the accuracy of calibration.

Figure 3B:
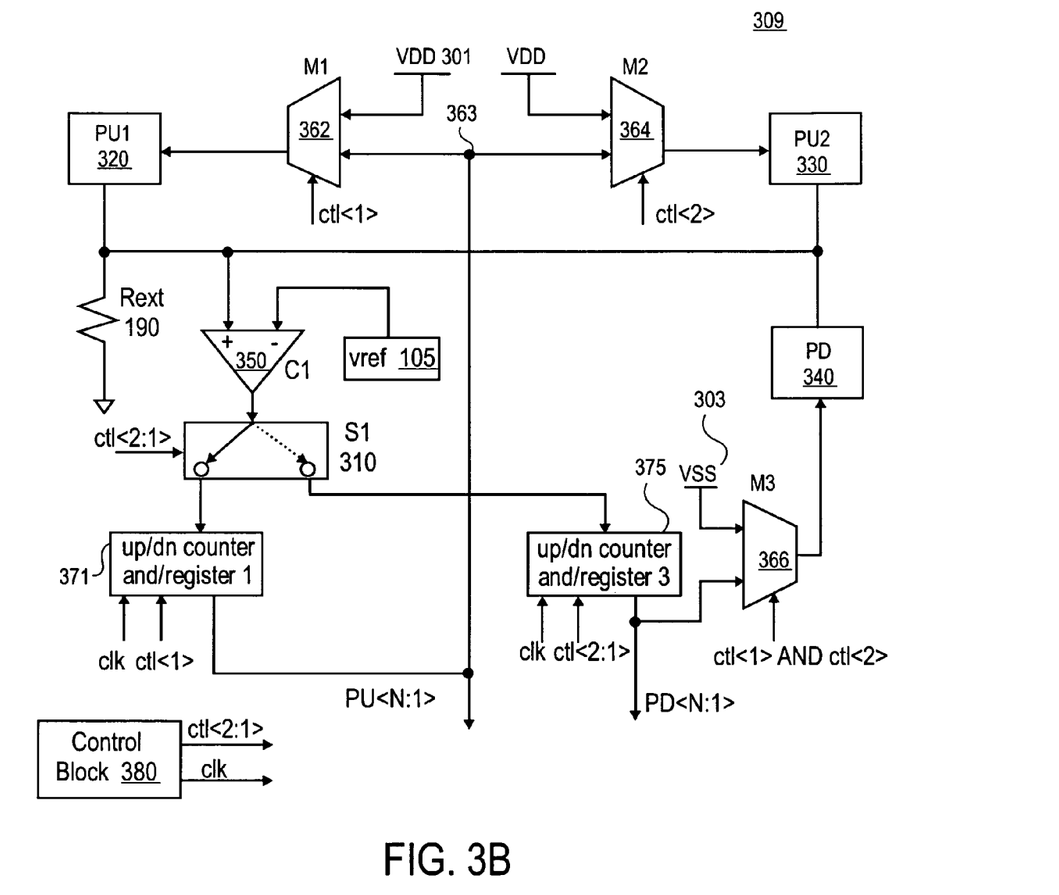
FIG. 3B shows an alternate embodiment of a replica circuit.

FIG. 3B shows an alternate embodiment of a replica circuit 309 for a variable impedance output driver. The replica circuit 309 in FIG. 3B has a two-loop topology as opposed to the three-loop topology shown in FIG. 3A. The replica circuit 309 includes a switch S1 310, a first pull-up structure PU1 320, a second pull-up structure PU2 330, a pull-down structure PD 340, a comparator C1 350, a first multiplexer M1 362, a second multiplexer M2 364, a third multiplexer M3 366, two up/down counter and register sets 371 and 375, a control block 380, and a reference impedance Rext 390. The reference impedance Rext 390 may reside on a separate integrated circuit die from the comparator C1 350. A first voltage supply 301, VDD, is input to both multiplexer M1 362 and multiplexer M2 364. A second voltage supply 303, VSS, is input to multiplexer M3 366. A reference voltage vref 305 is input to the negative terminal of comparator C1 350.

Referring to FIG. 3B, the inputs to the multiplexer M1 362 and the multiplexer M2 364 are shorted together at the node 363. Therefore, PU1 320 and PU2 330 are controlled by the same loop. As a result, the replica circuit 309 does not have an intermediate loop, unlike the embodiment shown in FIG. 3A. The count in the counter and register set 1 371, PU1<N:1>, is input to both the multiplexer M1 362 and the multiplexer M2 364. PU1 320 and PU2 330 are substantially identical. Minor mismatches between PU1 320 and PU2 330 may exist due to various factors, such as random process mismatches.

In one embodiment, the left loop is enabled to calibrate PU1 320 against Rext 390 while PU2 330 and PD 340 are disabled. After calibrating PU1 320, the control loop for PU1 320 is disabled. Then PU1 320, PU2 330, and PD 340 are enabled to calibrate PD 340.

Since the inputs to the multiplexer M1 362 and the multiplexer M2 364 are shorted together at the node 363, the content in the counter and register set 1 371, PU1<N:1>, is provided to both the multiplexer M1 362 and the multiplexer M2 364. Furthermore, the calibration result of PU1 320, as represented by PU1<N:1>, can be applicable to PU2 330 as well because PU1 320 and PU2 330 are substantially identical. Therefore, calibrating PU1 320 against Rext 390 calibrates PU2 330 as well. As a result, it takes less time to complete calibration using the replica circuit 309 in FIG. 3B. Furthermore, the replica circuit 309 in FIG. 3B uses less circuit layout area than the one in FIG. 3A because the replica circuit 309 includes fewer components.

FIG. 4 shows one embodiment of a variable impedance output driver 400 in a microelectronic device. The output driver 400 includes a pull-up predriver 410 (hereinafter, PreDriver (PU)), a pull-down predriver 420 (hereinafter, PreDriver (PD)), a pull-up structure PU1 412, a pull-down structure PD 422, a replica circuit 430, and an output pad 440. Examples of the replica circuit 430 include the embodiments depicted in FIGS. 3A and 3B. Moreover, one should appreciate that the microelectronic device may include multiple variable impedance output drivers sharing the same replica circuit. In one embodiment, PU1 412 and the PD 422 are substantially the same as PU1 320 and PD 340 (referring to FIGS. 3A and 3B), respectively, in the replica circuit 430. Alternatively, the PU1 412 and the PD 422 may be related to the PU1 320 and PD 340 (referring to FIGS. 3A and 3B) by a first and a second predetermined ratios. The first and the second predetermined ratios may or may not be identical.

The variable impedance output driver 400 receives an input 401 from the core logic (not shown). The input 401 is provided to both predrivers 410 and 420. PreDriver (PU) 410 also receives the signals PU1<N:1>414 from the replica circuit 430. Likewise, PreDriver (PD) 420 receives the signals PD<N:1>424 from the replica circuit 430. PU1 412 and PD 422 are set in response to PU1<N:1>414 and PD<N:1>424, respectively. For example, the signals PU1<N:1>414 and PD<N:1>424 may enable a number of pMOS devices and a number of NMOS devices in PU1 412 and PD 422, respectively, based on the calibration performed by the replica circuit 430 against a reference impedance (e.g., Rext 390 in FIGS. 3A and 3B) as described above.

In one embodiment, the N-bit conversion of PU1<N:1>414 and PD <N:1>424 is done at powering up of the microelectronic device. Minor re-calibration by the replica circuit 430 and subsequent conversion of PU1<N:1>414 and PD<N:1>424 may be performed periodically after powering up to accommodate for changes in power supply and/or temperature or degradation of device.

Figure 5A:
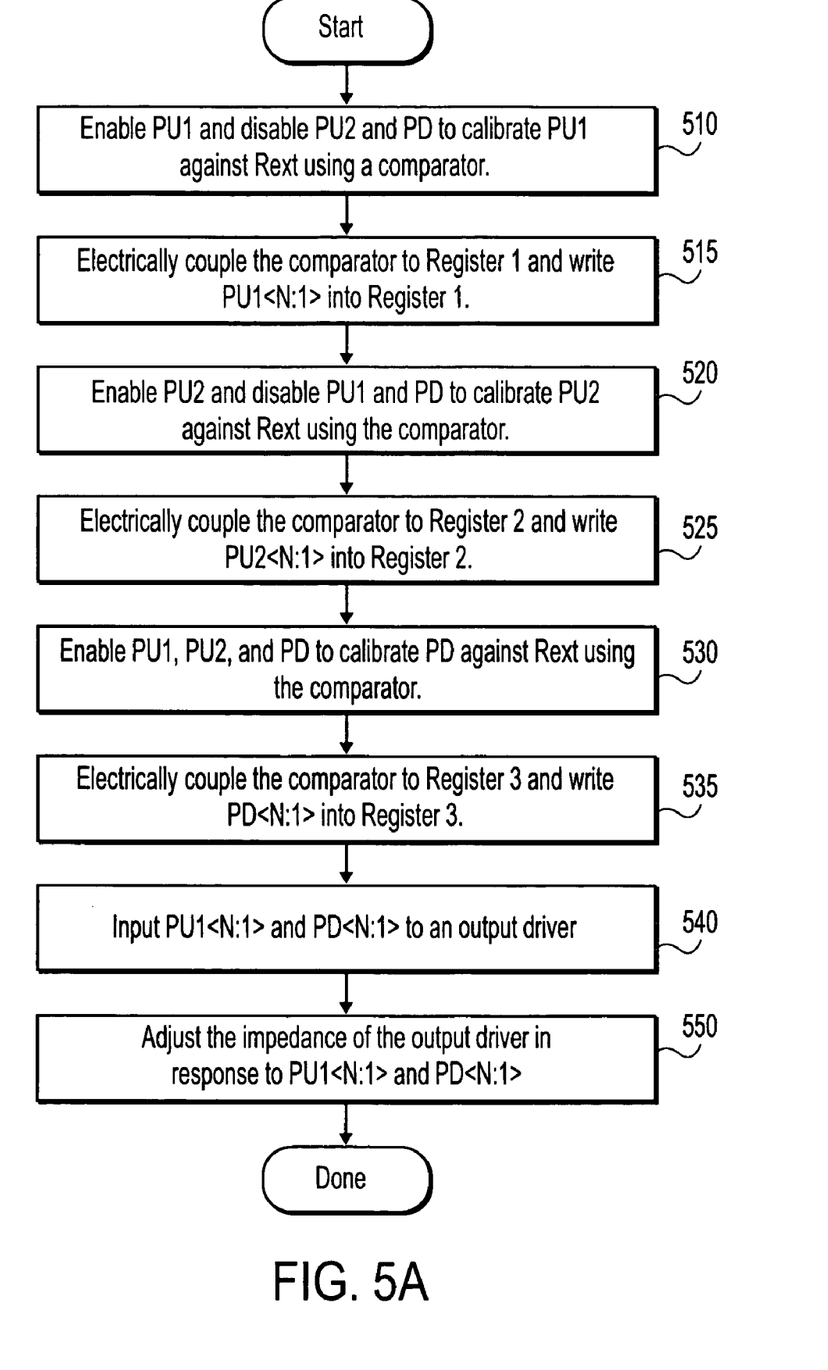
FIG. 5A shows one embodiment of a process to control an impedance of an output driver.

FIG. 5A shows one embodiment of a process to control an impedance of an output driver. At block 510, a first pull-up structure (PU1) is enabled and a second pull-up structure (PU2) and a pull-down structure (PD) are disabled to calibrate PU1 against a reference impedance (Rext) with a comparator. At block 515, the comparator is electrically coupled to a first register to write a value, PU1<N:1>, resulted from the calibration of PU1 into the first register. At block 520, PU2 is enabled while PU1 and PD are disabled to calibrate PU2 against Rext using the comparator. Likewise, the comparator is electrically coupled to a second register to write the value, PU2<N:1>, resulted from the calibration of PU2 into the second register at block 525. At block 530, PU1, PU2, and PD are enabled to calibrate PD against Rext with the comparator. Then at block 535, the comparator is electrically coupled to a third register to write the value, PD<N:1>, resulted from the calibration of PD into the third register. At block 540, PU1<N:1> and PD<N:1> are input to the output driver. At block 550, the impedance of the output driver is adjusted in response to PU1<N:1> and PD<N:1>.

Figure 5B:
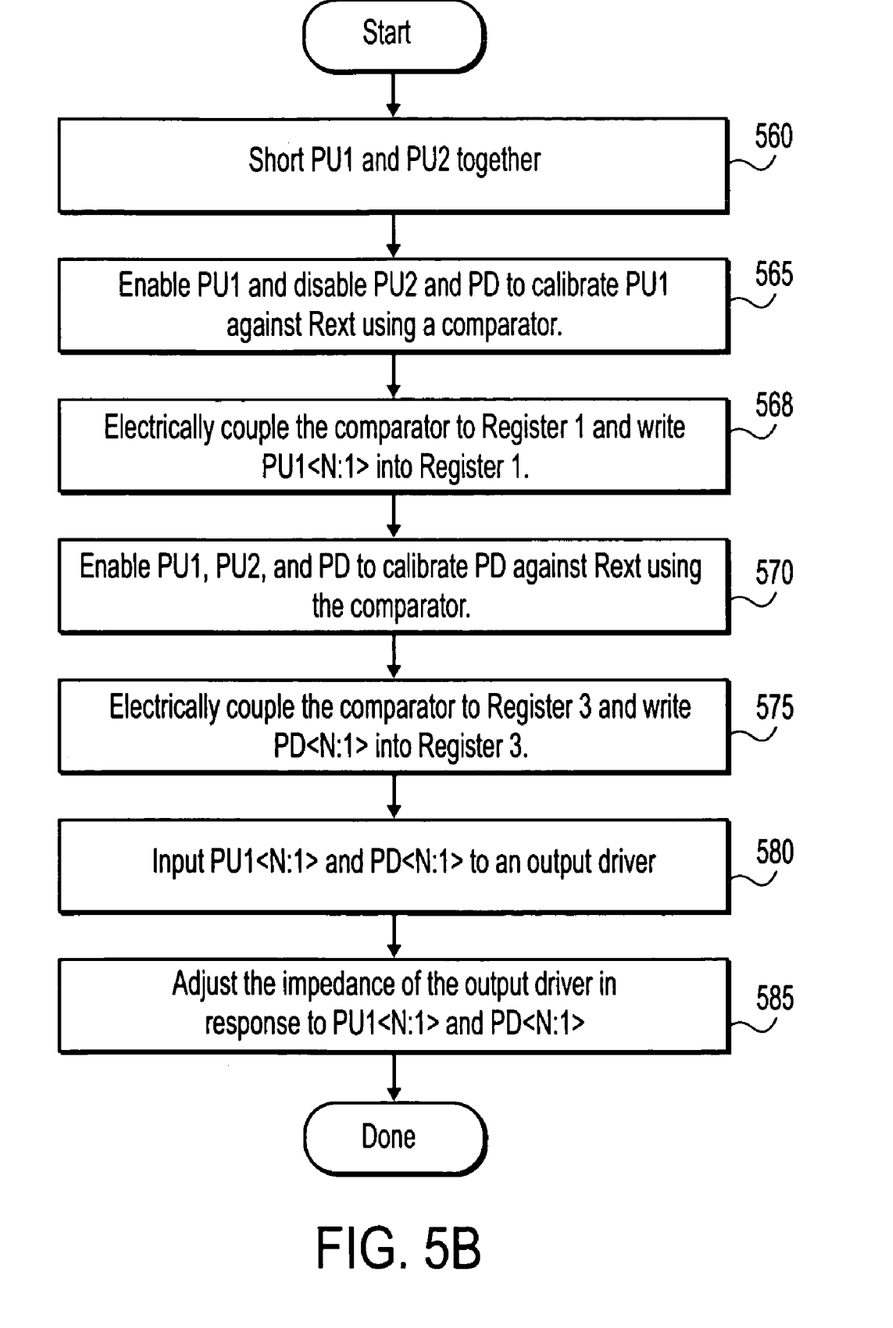
FIG. 5B shows an alternate embodiment of a process to control an impedance of an output driver.

FIG. 5B shows an alternate embodiment of the process to control an impedance of an output driver. At block 560, PU1 and PU2 are shorted together. At block 565, PU1 is enabled while PU2 and PD are disabled to calibrate PU1 against Rext using the comparator. At block 568, the comparator is electrically coupled to the first register to write PU1<N:1> resulted from the calibration of PU1 into the first register.

After calibrating PU1, at block 570, the control loop for PU1 is disabled. Then PU1, PU2, and PD are enabled to calibrate PD against Rext using the comparator. In one embodiment, PU1 and PU2 are substantially identical, and thus, PU1<N:1> is applicable to PU2 as well by symmetry. At block 575, the comparator is electrically coupled to the third register and PD<N:1> resulted from the calibration of PD is written into the third register. At block 580, PU1<N:1> and PD<N:1> are input to the output driver. At block 585, the impedance of the output driver is adjusted in response to PU1<N:1> and PD<N:1>.

Figure 6:
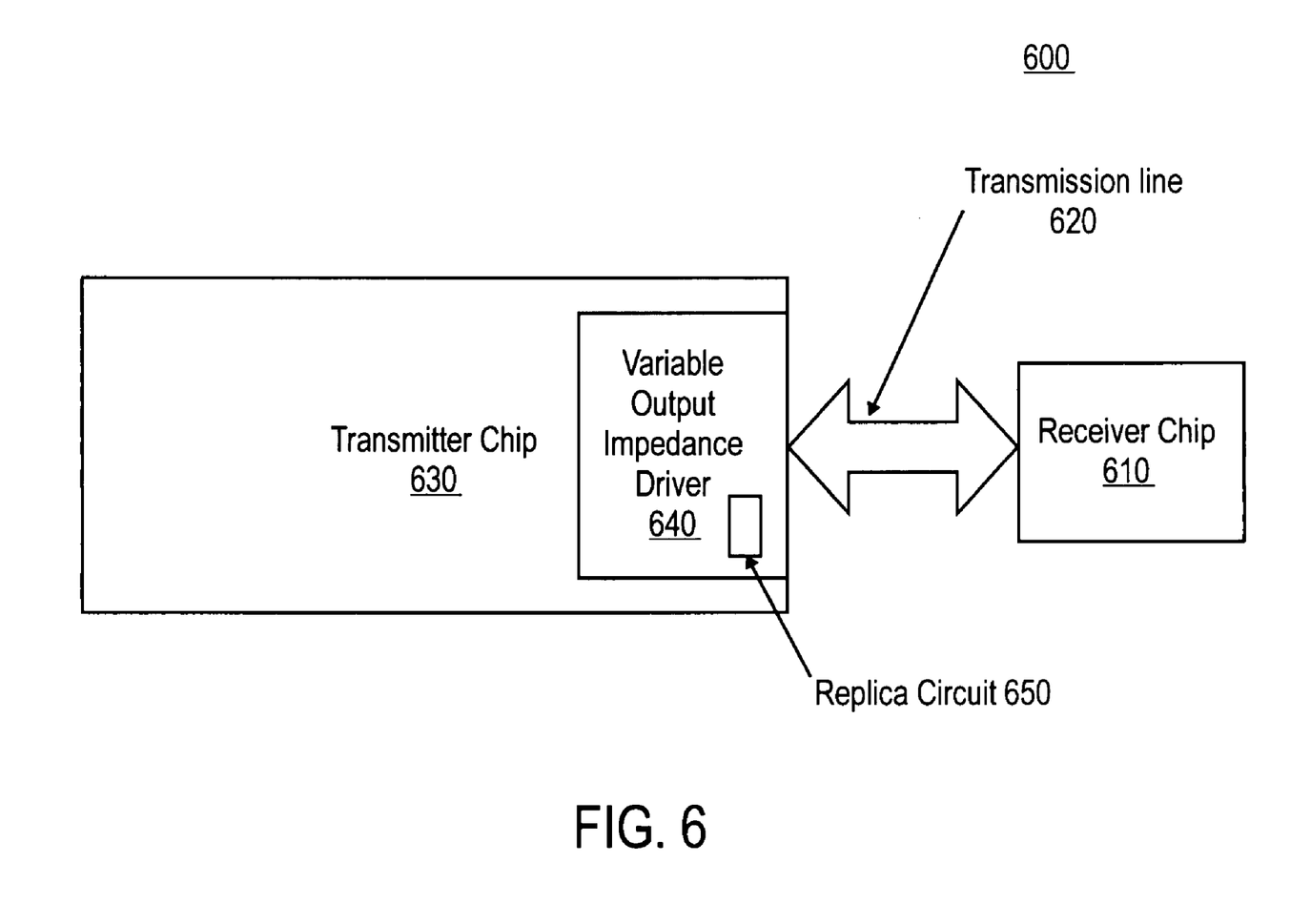
FIG. 6 shows an exemplary embodiment of a networked system.

FIG. 6 illustrates an exemplary embodiment of a networked system 600. The system 600 includes a receiver chip 610, a number of transmission lines 620, and a transmitter chip 630. The receiver chip may include multiple receivers. The transmission lines 620 couple the receiver chip 610 to the transmitter chip 630. The transmitter chip 630 includes a variable impedance output driver 640 to drive output signals onto the transmission lines 620 in order to send the output signals to the receiver chip 610. The variable impedance output driver 640 includes a replica circuit 650. In one embodiment, a single replica circuit 650 controls multiple output drivers. Exemplary embodiments of the replica circuit 650 are described in detail above with references to FIGS. 3A and 3B.

Note that any or all of the components of the networked system 600 and associated hardware may be used in various embodiments of the present invention. However, it can be appreciated that other configurations of the networked system may include some or all of the components illustrated in FIG. 6. Furthermore, other embodiments of the networked system may include additional components not illustrated in FIG. 6.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus comprising:
a first pull-up structure;
a pull-down structure;
a comparator, coupled to the first pull-up structure and the pull-down structure, to calibrate the first pull-up structure and the pull-down structure against a reference impedance; and
a second pull-up structure coupled to the comparator, wherein the comparator is operable to calibrate the second pull-up structure directly against the reference impedance.

2. The apparatus of claim 1, wherein the reference impedance resides with the comparator on an integrated circuit die.

3. The apparatus of claim 1, wherein the reference impedance resides on a package substrate.

4. The apparatus of claim 1, wherein the reference impedance resides on a printed circuit board substrate.

5. An apparatus comprising:
a first pull-up structure;
a pull-down structure;
a comparator, coupled to the first pull-up structure and the pull-down structure, to calibrate the first pull-up structure and the pull-down structure against a reference impedance;
a second pull-up structure coupled to the comparator, wherein the comparator is operable to calibrate the second pull-up structure against the reference impedance; and
a first, a second, and a third registers coupled to the first and the second pull-up structures and the pull-down structure, respectively, to store a plurality of input values to a plurality of output drivers.

6. The apparatus of claim 5, further comprising a first, a second, and a third counters coupling the comparator to the first, the second, and the third registers, respectively, to write the plurality of input values into the first, the second, and the third registers in response to an output of the comparator.

7. The apparatus of claim 6, further comprising a switch to electrically couple the output of the comparator to one of the first, the second, and the third counters.

8. The apparatus of claim 5,
wherein the first and the second pull-up structures are shorted together.

9. The apparatus of claim 8, wherein the first and the second pull-up structures are substantially identical.

10. The apparatus of claim 5, further comprising a plurality of transmission lines coupled to the plurality of output drivers.

11. The apparatus of claim 10, further comprising a plurality of receivers coupled to the plurality of transmission lines.

12. The apparatus of claim 5, wherein each of the plurality of output drivers comprises an output driver pull-up structure and an output driver pull-down structure, the output driver pull-up structure and the output driver pull-down structure being set in response to the plurality of input values.

13. The apparatus of claim 12, wherein the first pull-up structure and the pull-down structure are within a replica circuit, the output driver pull-up structure is substantially identical to the first pull-up structure in the replica circuit and the output driver pull-down structure is substantially identical to the pull-down structure in the replica circuit.

14. The apparatus of claim 12, wherein the first pull-up structure and the pull-down structure are within a replica circuit, an impedance of the output driver pull-up structure is related to an impedance of the first pull-up structure within the replica circuit by a first predetermined ratio, and an impedance of the output driver pull-down structure is related to an impedance of the pull-down structure within the replica circuit by a second predetermined ratio.

15. A method to control an impedance of an output driver, the method comprising:
calibrating a first pull-up structure with a comparator against a reference impedance;
calibrating a pull-down structure with the comparator against a network including the reference impedance, wherein calibrating the pull-down structure comprises enabling the first pull-up structure and a second pull-up structure; and
calibrating the second pull-up structure with the comparator directly against the reference impedance.

16. A method to control an impedance of an output driver, the method comprising:
calibrating a first pull-up structure with a comparator against a reference impedance;
calibrating a pull-down structure with the comparator against a network including the reference impedance, wherein calibrating the pull-down structure comprises enabling the first pull-up structure and a second pull-up structure;
calibrating the second pull-up structure with the comparator against the reference impedance; and
electrically coupling the comparator to one of a first, a second, and a third registers.

17. The method of claim 16, further comprising writing a first, a second, and a third values into the first register, the second register, and the third register, respectively, wherein the first, the second, and the third values correspond to impedances of the first pull-up structure, the second pull-up structure, and the pull-down structure, respectively.

18. The method of claim 17, further comprising adjusting the impedance of the output driver in response to the first and the third values.

19. The method of claim 16, further comprising:
shorting the first pull-up structure and the second pull-up structure.

20. An apparatus comprising:
means for calibrating a first pull-up structure directly against a reference impedance;
means for calibrating a second pull-up structure directly against the reference impedance;
means for calibrating a pull-down structure against the reference impedance, the first pull-up structure, and the second pull-up structure; and
means for adjusting an impedance of each of a plurality of output drivers in response to the calibrated first pull-up structure and the calibrated pull-down structure.

21. The apparatus of claim 20, further comprising:
means for providing a plurality of input values to each of the plurality of output drivers, wherein the plurality of input values correspond to an impedance of the first pull-up structure and an impedance of the pull-down structure.

* * * * *